United States Patent [19]

Roesner

[11] 4,144,098

[45] Mar. 13, 1979

[54] P+ BURIED LAYER FOR I²L ISOLATION BY ION IMPLANTATION

[75] Inventor: Bruce B. Roesner, Tustin, Calif.

[73] Assignee: Hughes Aircraft Company, Culver City, Calif.

[21] Appl. No.: 791,912

[22] Filed: Apr. 28, 1977

[51] Int. Cl.² .................. H01L 27/04; H01L 21/265; H01L 21/22; H01L 29/72

[52] U.S. Cl. .................................. 148/1.5; 148/187; 357/47; 357/91; 357/92

[58] Field of Search ................... 148/1.5, 187; 357/47, 357/48, 91, 92

[56] References Cited

U.S. PATENT DOCUMENTS

| | | | |
|---|---|---|---|
| 3,768,150 | 10/1973 | Sloan, Jr. et al. | 29/578 |
| 3,865,648 | 2/1975 | Castrucci et al. | 148/175 |
| 3,999,215 | 12/1976 | Aagaard | 357/48 |
| 4,005,470 | 1/1977 | Tucci et al. | 357/36 |
| 4,038,680 | 7/1977 | Yagi et al. | 357/44 |
| 4,043,849 | 8/1977 | Kraft et al. | 148/187 |
| 4,045,251 | 8/1977 | Graul et al. | 148/1.5 |
| 4,047,975 | 9/1977 | Widmann | 148/1.5 |
| 4,076,556 | 2/1978 | Agraz-Guerena et al. | 148/1.5 |

OTHER PUBLICATIONS

Berger et al., "Base Ring Transistor—," IBM-TDB, 14 (1971), 302.

Primary Examiner—L. Dewayne Rutledge
Assistant Examiner—Upendra Roy
Attorney, Agent, or Firm—Joseph E. Szabo; W. H. MacAllister

[57] ABSTRACT

A selected transistor in an integrated circuit formed in an N-type substrate is isolated from the substrate and from other transistors formed therein by surrounding an N-type island within the substrate with a P-type shell and forming the selected transistor in and above the N-type island.

8 Claims, 20 Drawing Figures

P+ BURIED LAYER FOR I²L ISOLATION BY ION IMPLANTATION

BACKGROUND OF THE INVENTION

Integrated injection logic (I²L), also called "merged transistor logic" (MTL), is fast becoming a major digital circuit technology due to its high packing density and very low power dissipation. In implementing an integrated circuit using I²L technology it is desirable to combine a relatively large number of I²L circuits with significantly fewer vertical coupling transistors which are isolated from the I²L circuits. For reasons which will become clear hereinafter, to attain the desired isolation it has been thought necessary to also isolate the emitter region of the I²L device from the substrate. This in turn has required that contact be made to the emitter region from the surface of the substrate. Normally, where isolation is not required, contact to the I²L emitter would be made through the substrate itself. Due to the relatively large number of I²L devices, the additional surface contacts significantly increased the area required per device at the expense of circuit density. Moreover, since contact to the emitter is made near one of its ends, the series resistance in the I²L emitter circuit is considerably greater than in the nonisolated I²L circuit, in which contact between the substrate and the emitter is over the entire substrate-emitter interface.

It is therefore the principal object of the present invention to devise an improved way to isolate the I²L circuits of an integrated circuit from their associated coupling transistors so as to increase circuit density and reduce their series emitter resistance.

The above and other objects of the present invention are attained by providing a P-type isolating shell region between the substrate and each of the coupling transistors of the integrated circuit. While this still requires that a surface contact be made to the emitter of each coupling transistor, it eliminates the need to isolate the I²L circuits from the substrate. Hence the need for a surface contact to their emitters is eliminated, since that contact may now be made through the substrate. The elimination of the surface contact from the emitters of the I²L devices results in a significant saving of space because there are many more I²L devices in the integrated circuits than there are coupling transistors.

Further features of the invention will become apparent from the following detailed description with reference to the attached drawings, in which.

In order to reflect the evolution of the present invention, there will first be described with reference to FIG. 1 an earlier type of I²L device wherein the device was not isolated from the substrate. Then, with reference to FIGS. 2 and 2a, a slightly different device will be described wherein both the I²L device and an adjacent coupling transistor are isolated from the substrate. Finally, with reference to FIGS. 3–13 there will be described an integrated circuit made in accordance with the present invention wherein only the coupling transistor is isolated from the substrate and the I²L device is not, so that its emitter may be fed from the substrate as is the case with the prior art circuit of FIG. 1.

Figure 1:
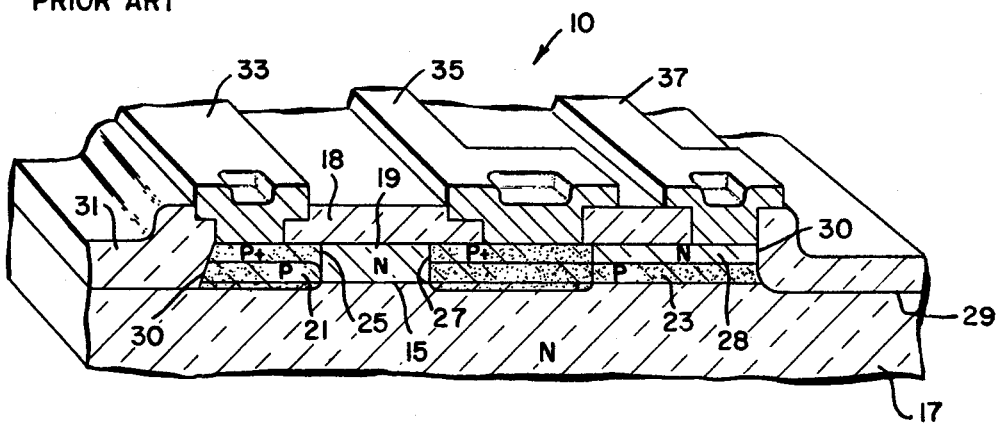
FIG. 1 is a perspective cut-away view of a non-isolated prior I²L device made by auto-doping into an epitaxial layer.

Referring first to FIG. 1, the integrated circuit 10 illustrated therein is, except for one detail, identical to that disclosed in FIG. 12b of co-pending U.S. Patent application Ser. No. 736,976, filed by Bruce B. Roesner and Denis J. McGreivy on Oct. 29, 1976, and entitled "Integrated Injection Logic Structure and Method For Its Fabrication", now U.S. Pat. No. 4,101,349. As more fully described in that application, the device 10 of FIG. 1 is formed in an N-type substrate 17 by creating doped regions in the substrate surface 15. An epitaxial layer of silicon 19 is then grown on the substrate surface 15 and, by diffusing some of the dopant from the doped regions into the epitaxial layer 19 through a process known as "auto-doping", buried P regions 21 and 23 are formed. Through an oxide mask (not shown) a P-type dopant is driven into the epitaxial layer 19 to form P-type regions 25 and 27 which respectively extend down to the buried P-type regions 21 and 23. To provide proper isolation for the device, it is etched along lines 30 down to a level 29 which is below the original substrate-epitaxial layer interface 15. The areas to be etched are defined by a nitride-oxide mask (not shown) which was formed on top of the epitaxial layer 19 after it was grown. The nitride layer is removed after the etching down to level 29, but the oxide part of the mask remains as the portion 18. A thick oxide layer 31 is then grown over the exposed surface of the substrate and of the epitaxial layer. Openings are then etched through the oxide layer 18, and emitter, base, and collector contacts 33, 35 and 37 are formed by conventional metal deposition and etching techniques. The resulting I²L device comprises a vertical transistor whose collector, base, and emitter are respectively formed by the regions 28, 23, and the substrate 17. The device also includes a lateral transistor whose emitter, base, and collector are respectively formed by the regions 21, 19 and 23.

Figure 2:
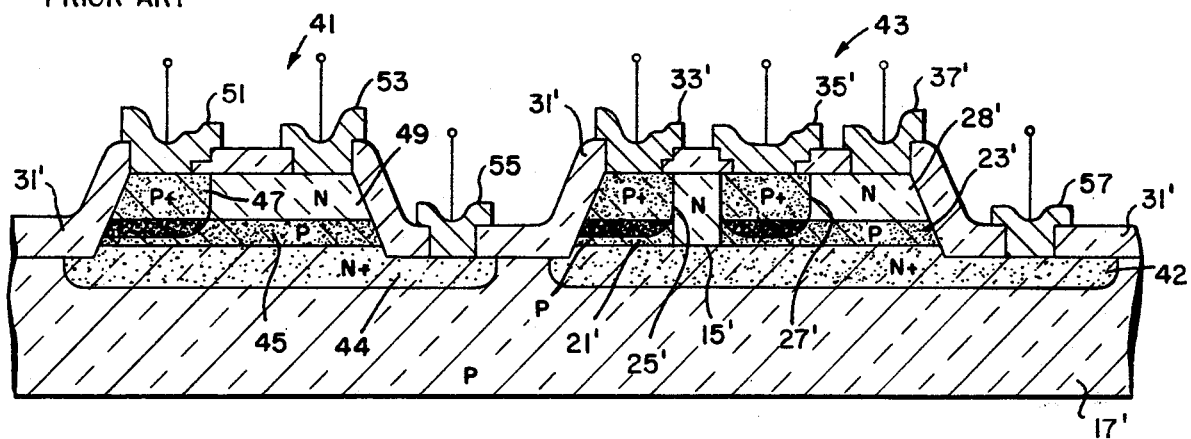
FIGS. 2 and 2a are cross sectional and plan views of an isolated prior I²L device similar to that of FIG. 1.
Figure 2A:
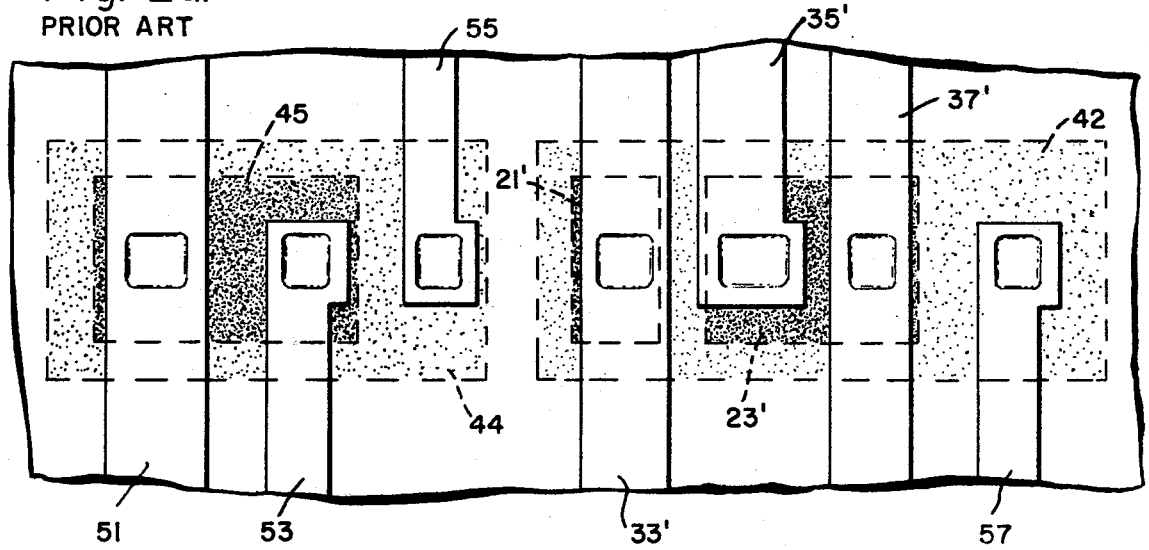

FIGS. 2 and 2a illustrate how a device 43 of the type shown in FIG. 1 may be made, along with an adjacent coupling transistor 41 so that they might be isolated, one from the other. The steps involved in making the integrated circuit illustrated in FIGS. 2 and 2a are, for the most part, identical to those involved in making the device of FIG. 1. Since the resulting I²L device 43 is structurally similar to that illustrated in FIG. 1, those portions of the I²L device 43 illustrated in FIG. 2 which correspond to similar elements of the FIG. 1 device will be identified by the same reference numerals, but with an apostrophe (') added.

The principal difference in the method and the resulting device which sets off FIGS. 2 and 2a from FIG. 1 is that the devices 41 and 43 are made in a P-type substrate 17', rather than an N substrate as in FIG. 1. The reason for this is that the devices 41 and 43 are formed in a pair of N+ wells 44 and 42, respectively. These wells are formed by conventional techniques and, except for interposing the extra step by which these wells are formed, the subsequent steps may follow exactly the series used for producing the device of FIG. 1. Thus, after the N+ wells 44 and 42 have been formed in the substrate 17', P doped regions are formed in the N+ wells 44 and 42 after which an epitaxial layer is formed over the substrate surface. The P doped regions in the N+ well 42 auto-dope into the epitaxial layer while it is grown to form buried regions 21' and 23' of the device 43. Similarly, from an additional P doped region in the N+ well 44, dopants auto-dope up into the epitaxial layer to form the region 45 of the device 41 which will subsequently form the base of that device. Thereafter, P+ dopant is driven into the epitaxial layer to form the P+ region 47 in the coupling transistor 41 and the regions 25' and 27' in the I²L device 43. Selected areas in the surface of the epitaxial layer and of the substrate are etched away to leave the mesas which form the devices 41 and 43, after which a protective oxide layer 31' is grown. Through openings formed in the oxide layer 18', the injector, base, and collector contacts 33', 35', 37' are formed. At the same time, base and collector contacts 51 and 53 are formed for the coupling transistor 41. Emitter contacts 57 and 59 are formed subsequently.

It will be observed that, in order to obtain the desired isolation, both the coupling transistor 41 and the I²L device 43 have been isolated from the substrate 17. Hence, each requires an emitter contact, since their emitters can no longer be fed through the substrate. The coupling transistor 41 will be seen to correspond exactly to the vertical transistor of the I²L device 43.

Figure 13B:
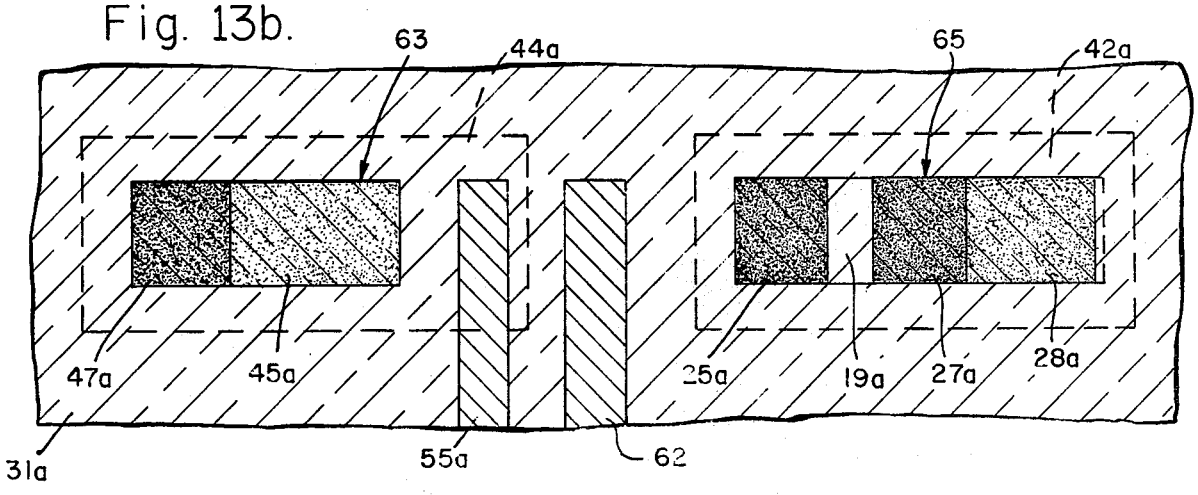
FIGS. 13, 13a and 13b are cross sectional and plan views of the device after openings have been made in the oxide layer formed during the previous step on top of the epitaxial layer and contacts have been formed through those openings to active portions of the devices formed in the epitaxial regions.
Figure 13:
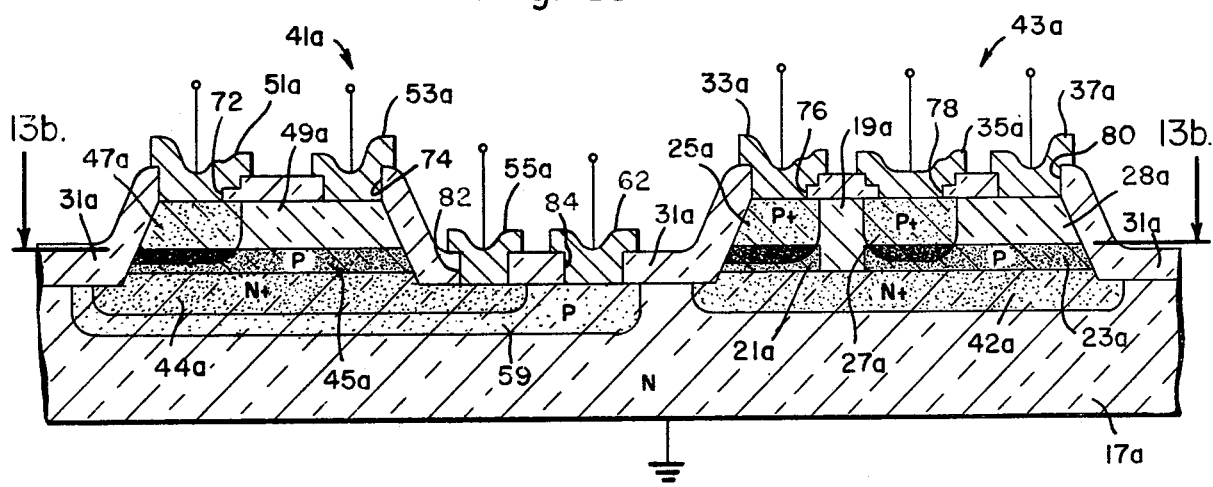
Figure 13A:
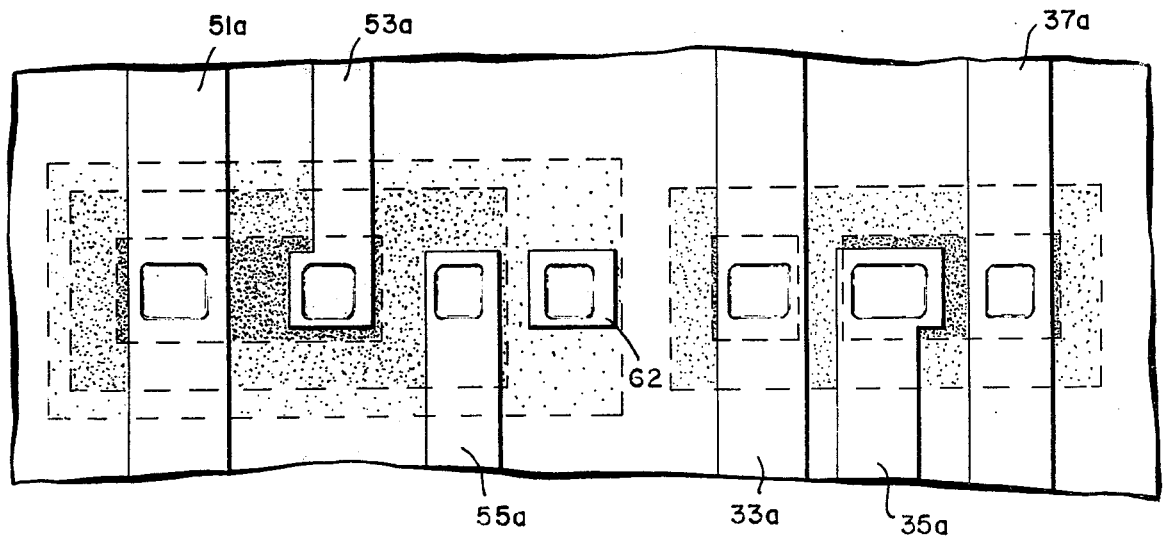

The improved integrated circuit of the present invention is illustrated in FIGS. 13 and 13a. It has many of the elements of the integrated circuit of FIGS. 2 and 2a. Consequently, each element of FIGS. 13 and 13a having a corresponding element in the device of FIGS. 2 and 2a is identified by the same reference numeral as is used in FIGS. 2 and 2a, but with the suffix "a" added.

A comparison of FIGS. 2 and 13 reveals that the novel circuit of FIG. 13 differs from that of FIG. 2 in the following particulars:

1. The conductivity type of substrate 17a is N; that of substrate 17' in FIG. 2 is P.
2. A P-type shell region 59 separates the N+ well 44a from the N-type substrate 17a.
3. The emitter contact 57 of the FIG. 2 circuit has been eliminated from the I²L device 43a of FIG. 13.
4. A contact 62 to the P-type shell region 56 has been added to the coupling transistor 41a of FIG. 13.

It should be noted that the contact 62 may be eliminated, since the P-type shell region 59 will form an NPN transistor with the substrate 17a and the N region 44a. This transistor may provide the desired isolation. The contact 62 simply provides a means for applying a reference voltage to the base of that transistor to keep that transistor turned off.

By using an N-type substrate instead of a P-type substrate, the I²L device 43a is no longer isolated from the substrate 17a, eliminating the need for a contact to its emitter 42a. The necessary isolation for the coupling transistor 41a is provided by the additional P-type shell region 59 to which contact is made so that, by applying a suitable voltage to the contact, isolation may be maintained between the substrate 17a and the emitter 44a of the coupling transistor 41a. The desired objects of the invention are attained, since contact to the I²L emitter 42a is along the entire interface of that emitter with the N-type substrate 17a, hence giving minimum series emitter resistance in that device. Moreover, the number of contacts is reduced by eliminating the need for an emitter contact to the I²L emitter region 42a. The fact that an additional contact 57 has to be provided for the coupling transistor 41a can be tolerated, since there are fewer such transistors than there are I²L devices on the typical integrated circuit chip, so that a net saving is still achieved.

The P-type shell 59 may be created either entirely during the implantation being described with reference to FIG. 5 or during that and subsequent steps cumulatively. The energy used for the ion implantation step will be selected so as to drive the boron ions down below the bottom of the N+ region 44a. If, on the other hand, the P shell configuration is obtained during subsequent steps, it will be either because of the driving effect of the steps which follow the growing of the epitaxial layer which will be described next with reference to FIG. 6, or because of the combination of that driving effect and the energy being used for the ion implantation during the step described with reference to FIG. 5. Nor would the total driving effect be achieved only during the growing of the epitaxial layer. Steps which follow it, such as the growing of the oxide layer 31a and the forming of the driving of the P+ diffusions 47a, 25a and 27a, may also contribute thereto. In practice, one may calculate the energy desired for the ion implantation that is necessary to cause that step to form the buried P region 59a. Alternatively, if one does not wish that step alone to drive the boron underneath the N+ layer 44a, one may calculate the process times and temperatures of those steps to achieve the desired objective. Yet another way of accomplishing the same thing is to take spreading resistance measurements of the device after it has been fabricated to determine when the P dopant has diffused sufficiently into the substrate to form the P shell region 59. It should be noted that the P shell region 59 does not extend all the way to the surface of the substrate 17a after the ion implantation step. The reason for this is that if it did, the dopant would diffuse into the epitaxial layer 48 which is subsequently grown on that surface. This would be an undesirable side effect which is best avoided.

Figure 3:
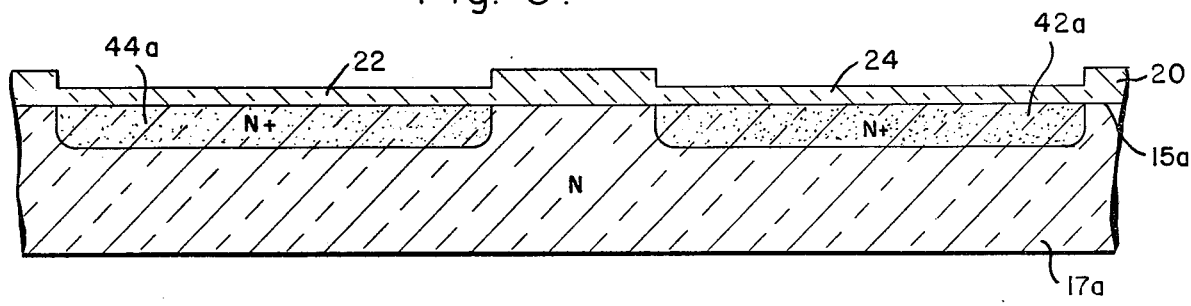
FIGS. 3 and 3a are cross sectional and plan views of a device manufactured in accordance with the present invention during an initial stage of its manufacture, just after an N+ diffusion and drive operation into an N- type substrate.
Figure 3A:
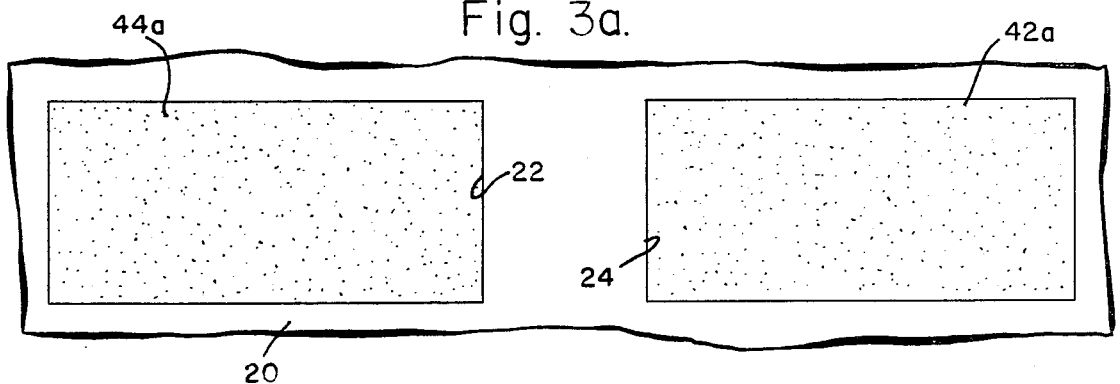

Turning now to FIGS. 3-13a, the preferred method for fabricating the integrated circuit of FIGS. 13 and 13a will be described. The process begins by oxidizing the surface 15a of an N-type substrate 17a so as to create an oxide mask 20 thereon. A resistivity of approximately 1 ohm-centimeter has been found suitable for the substrate. A photoresist is then formed over the oxide mask 20 and openings are etched therethrough at 22 and 24 (FIGS. 3 and 3a). N-type dopant, such as antimony, is next diffused at the substrate surface 18 where it is exposed through the oxide mask openings at 22 and 24 and the dopant is driven into the substrate to create the N+ regions 44a and 42a shown in FIGS. 3 and 3a.

Figure 4:
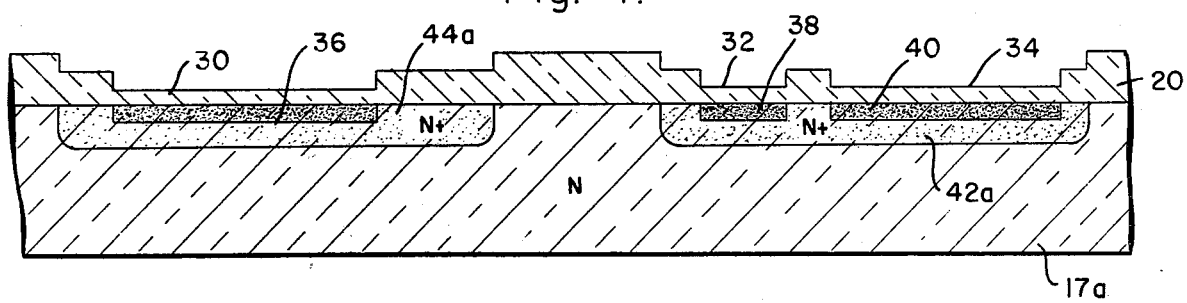
FIGS. 4 and 4a are cross sectional and plan views of the same device after a P+ diffusion and drive into the N+ regions.
Figure 4A:
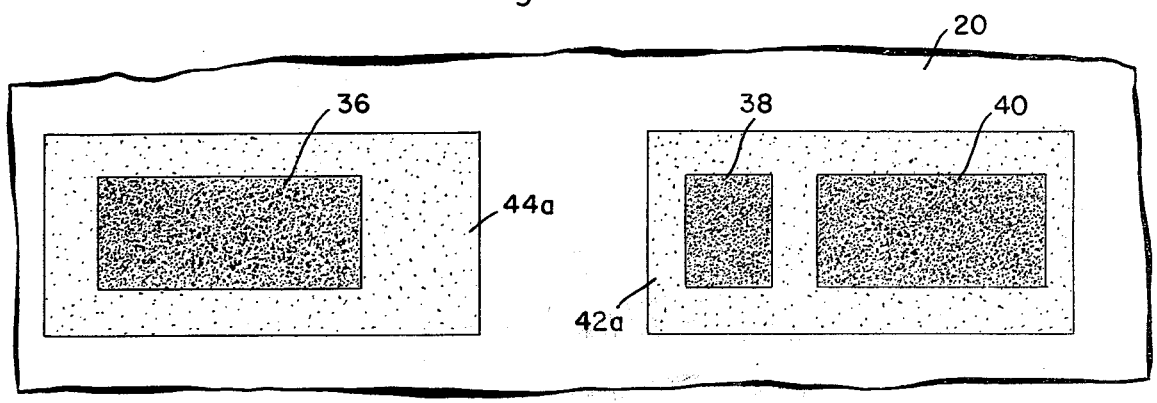

Additional openings are formed in the oxide layer 20 at 30, 32 and 34 and boron is diffused or implanted into the substrate surface 18 where it is exposed through the openings 30, 32 and 34 so as to create the P-type regions 36, 38 and 40 as shown in FIGS. 4 and 4a.

Figure 5:
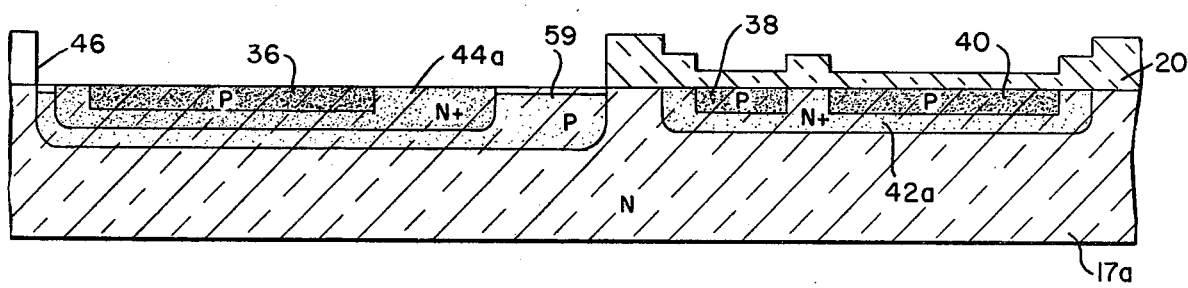
FIGS. 5 and 5a are cross sectional and plan views of the device after boron has been ion implanted into the substrate surface in the vicinity of one of the N+ regions previously formed.
Figure 5A:
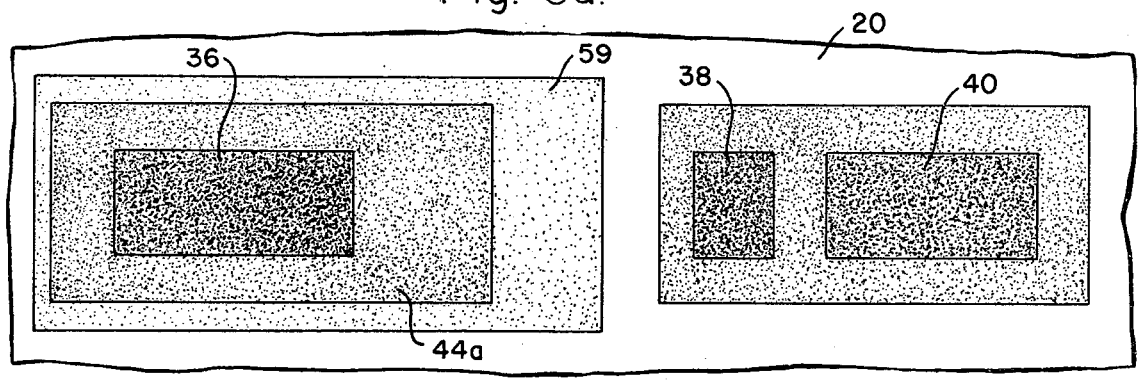

The oxide layer 20 is again masked and etched to form the opening 46 illustrated in FIG. 5. Boron is then implanted into the portion of the substrate surface 18a exposed by the opening 46 so as to create a P-type shell 59 in the substrate 17a.

The concentration of the dopant used to create the P-type shell region 59 should be selected so as not to reverse the conductivity type of the N+ region 44a which is surrounded by the P-type shell region 59. Of course, the P-type dopant concentration used previously to create the P-type region 36 within the N-type region 44a will have to be lower than that used to create region 44a since it is not desired to invert the conductivity type of the region 44a to create the P-type region 36. The purpose of the region 36 is simply to provide a source of dopants for the next step during which these dopants will "up-diffuse" into the epitaxial layer to be grown on the surface of the substrate 17a. Thus, it is seen that the dopant concentration used to create region 44a should be higher than that used to create the regions 59 and 36. Typical values used are $5 \times 10^{19}/cm^3$ for the region 44a, and $1 \times 10^{17}/cm^3$ for the regions 36 and 59.

Figure 6:
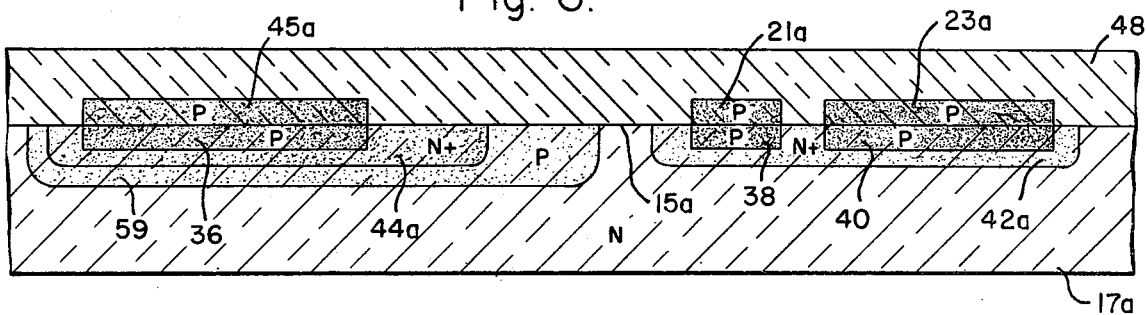
FIGS. 6 is a cross section through the device after an epitaxial silicon layer has been grown on the substrate surface.

The entire remaining oxide layer 20 is next removed and an N-type layer of epitaxial silicon 48 is grown in FIG. 6. During the growing of the epitaxial layer 48, P-type dopant from the regions 36, 38 and 40 autodopes into that layer to form corresponding buried P-type regions 45a, 21a and 23a in the epitaxial layer.

This step is described in detail in the above-referenced patent application. As noted there, a layer may be grown by exposing the substrate surface 18a to a silane (SiH4) atmosphere at 1000° C. so as to grow a layer 1.4 microns thick with a resistivity of 0.6 ohm-centimeters and an N dopant concentration of $8 \times 10^{15}/cm^3$. A suitable doping concentration for the buried regions 45a, 21a and 23a has been found to be on the order of $1 \times 10^{17}/cm^3$.

Figure 7:
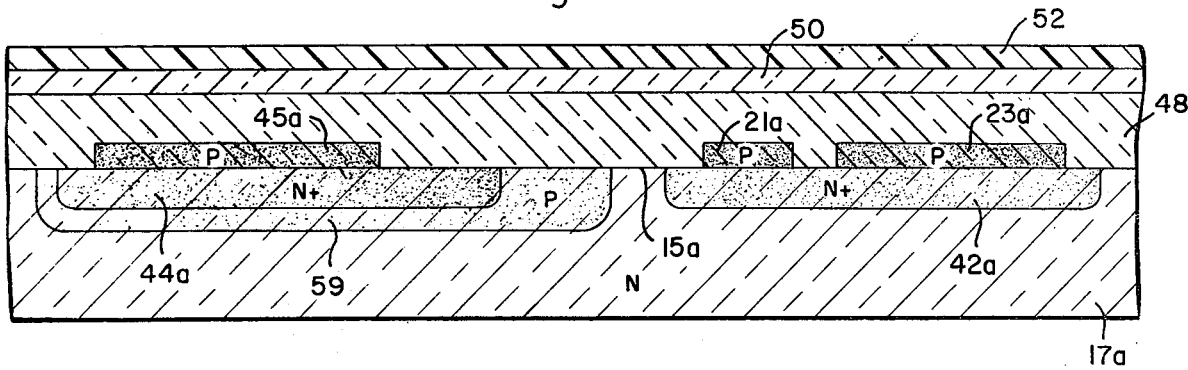
FIG. 7 is a cross section through the device after a silicon oxide and a silicon nitride layer have been deposited on the epitaxial layer to form a mask.
Figure 8:
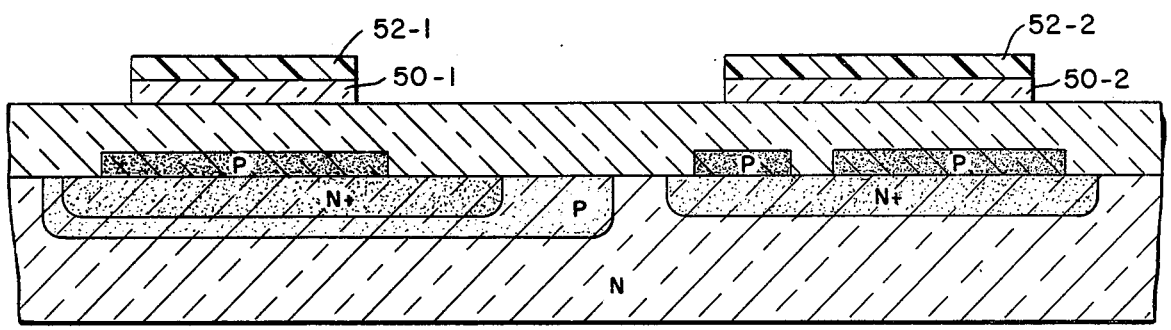
FIG. 8 is a cross section of the device after portions of the oxide and nitride layers have been etched away to define the mask.
Figure 9:
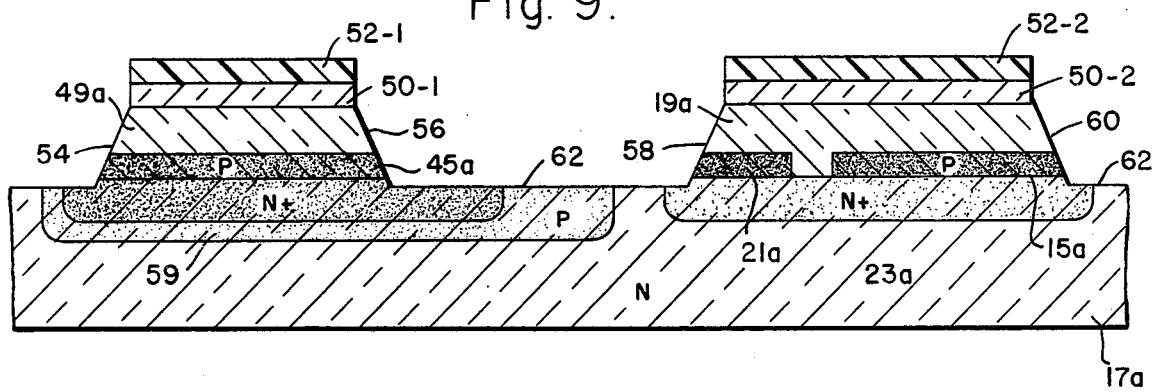
FIG. 9 is a cross section of the device after the unmasked portions of the epitaxial layer have been etched away, along with a thin surface portion of the underlying silicon substrate.
Figure 10:
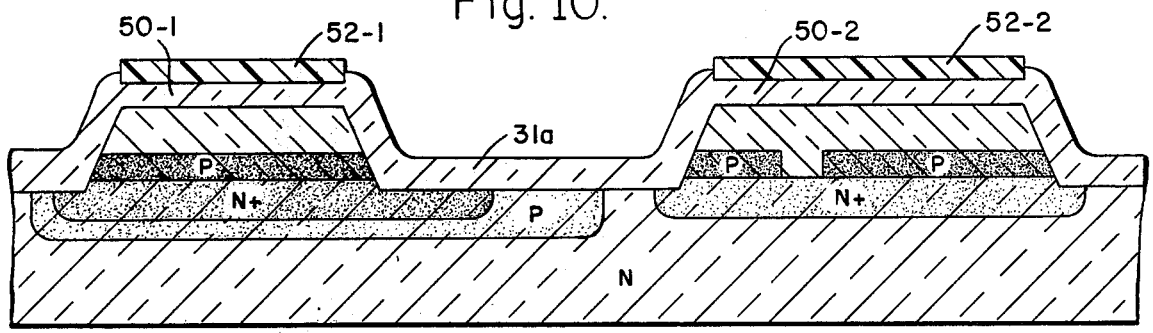
FIG. 10 is a cross section of the device after a thick protective oxide layer has been formed along the edges of the remaining portions of the epitaxial layer and over the exposed substrate surface.
Figure 11:
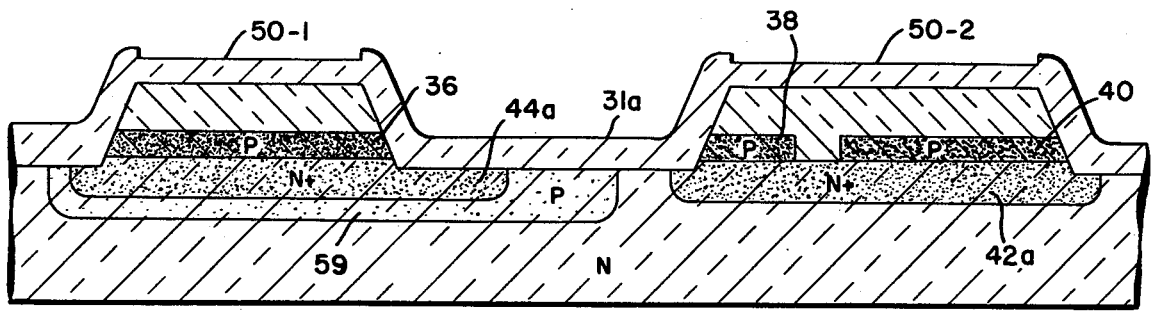
FIGS. 11 and 11a are cross section and plan views of the device after the remaining portions of the silicon nitride mask have been removed.
Figure 11A:
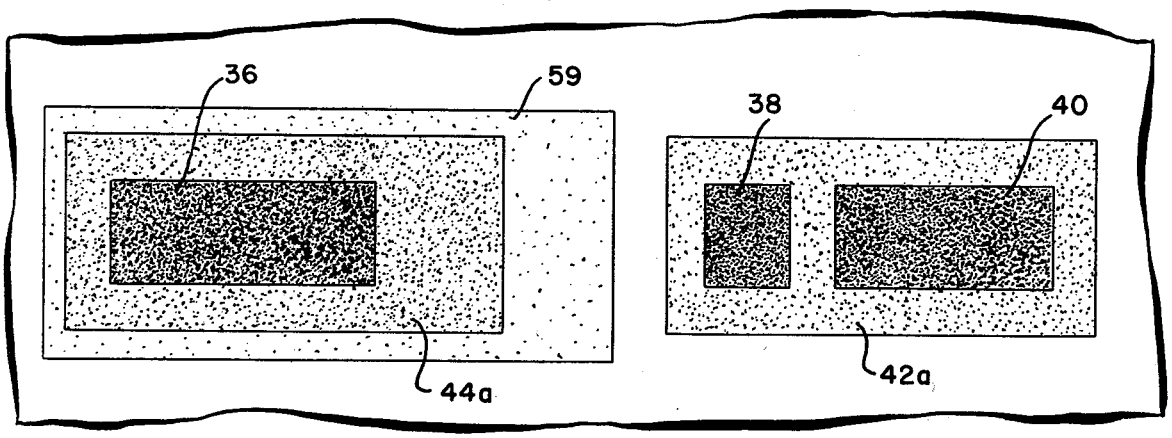

After forming the epitaxial silicon layer 48, a thin (typically 1000A°) oxide layer 50 is grown thereon, after which a nitride layer 52 (typically 400A°) is deposited on top of the thin oxide layer 50 (FIG. 7). A photoresist mask is then formed on top of the nitride layer 52. Either a positive or a negative photoresist process may be used. Assuming that a positive photoresist process is being used, the photoresist is exposed over those areas where the nitride and oxide layer 52 and 50 are to be etched away. Selective nitride and oxide etchants are then applied in succession through the areas opened in the photoresist, leaving the double layered mesa regions 50-1, 52-1, and 50-2, 52-2 as shown in FIG. 8. The remaining portions of the photoresist may be removed either after the nitride etch or after the oxide etch. These double layered regions serve as a mask for the next etching step which is directed at removing exposed portions of the epitaxial layer 48 along the lines 54, 56, 58 and 60 as shown in FIG. 9. The etchant is allowed to penetrate through the epitaxial layer 48 into the exposed portions of the substrate surface 15a down to a level 62 below the original substrate surface 15a, resulting in the device configuration illustrated in FIG. 9. The configuration of the two mesa regions shown in FIG. 9 as defined by the sides 54, 56, 58 and 60 is also shown in FIGS. 13a and 13b by the two rectangles 63 and 65. Thereafter, as illustrated in FIG. 10, a thick (typically 4000A°) oxide layer 31a is grown over all of the exposed silicon and epitaxial silicon. Consequently, the resulting thick oxide layer 31a is interrupted only by the silicon nitride portions 52-1 and 52-2 over which silicon oxide will not grow. Those silicon nitride portions are next removed, resulting in the configuration of FIGS. 11 and 11a.

Figure 12:
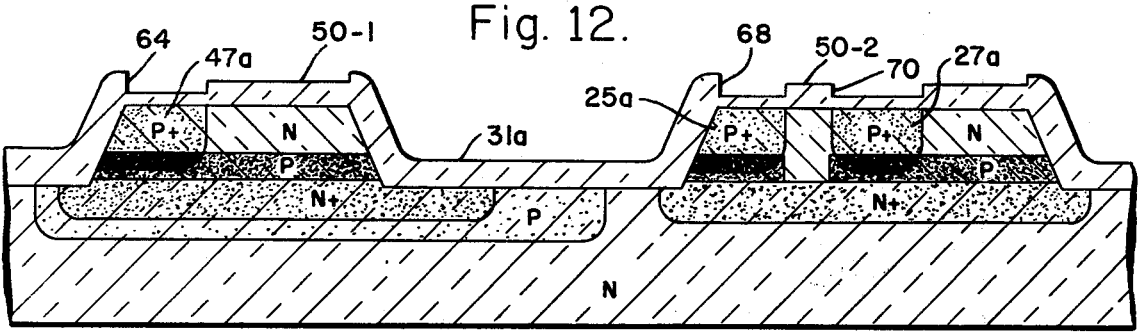
FIG. 12 is a cross section of the device after a P+ dopant has been diffused and driven into the exposed surface portions of the epitaxial layer.

Openings are next formed through the thin oxide regions 50-1 and 50-2 at 64, 68 and 70 (FIG. 12). Boron is then driven into the surface of the epitaxial layer regions 49a and 19a exposed through the openings 64, 68 and 70 to form P+ regions 47a, 25a and 27a. The details of this step are not critical to the present invention and will be subject to choice by one skilled in the art. One set of suitable parameters which may be used is that described in the above-identified co-pending application which is incorporated herein by this reference.

As shown in FIGS. 13 and 13a, another set of openings 72, 74, 76, 78 and 80 is etched through the thin oxide 50-1 and 50-2 on top of the isolated epitaxial layer regions 49a and 19a and through these openings electrical contacts 51a, 53a, 33a, 35a and 37a are made to various portions of the epitaxial regions as shown. Conventional metal deposition masking and etching techniques may be used for the forming of these contacts. Thereafter, an additional pair of openings 82 and 84 is made through the thicker oxide layer 31a, and electrical contacts 55a and 62 are made through these openings to the N+ region 44a and the P region 59, respectively. As noted previously the contact 62 may be eliminated. The reason why the latter two contacts are made separately from the former five contacts is that different etching times are required through the thick and thin oxide regions. In order to minimize the effects of misalignment it is desirable to cut the etching time through the thin oxide layers on top of the isolated epitaxial layer regions 49a and 19a to a minimum.

It will thus be apparent that, by means of the present invention a significant improvement has been made in the type of integrated circuit previously made in accordance with the methods described with reference to FIGS. 1, 2a and 2b. Isolation of the coupling transistor has been accomplished without burdening the I²L transistor with an extra emitter contact, at the expense only of a single additional processing step whereby the P-type isolating shell region is formed between the substrate and the active regions of the coupling transistor.

What is claimed is:

1. In a method of fabricating an integrated circuit the steps of:
   a. driving into first and second spaced apart regions in the surface of an N-type silicon body, an N conductivity dopant to create first and second N-type regions therein;
   b. driving into said surface a P-type dopant in selected areas to create a first P-type region entirely within said first N-type region and second and third spaced apart P-type regions entirely within said second N-type region;
   c. implanting a P-type dopant into said surface over an area which includes, and extends beyond all sides of, said first N doped region;
   d. growing an N-type epitaxial silicon layer on said surface, and auto-doping P-type dopant from said first, second and third P-type regions to form corresponding first, second and third buried P-type regions in said epitaxial layer;
   e. forming a mask, including a first oxide layer, over said epitaxial layer;
   f. removing portions of said epitaxial layer unprotected by said mask and the top layer of said body immediately underlying said portions so as to create first and second mesas based entirely within said first and second N-type regions and growing a second oxide layer over the sides of said mesas and over the surface of said body exposed by the removal of said top layer; and
   g. opening said first oxide layer over said mesas and driving P conductivity dopant into said epitaxial layer to form P-type vertical regions which extend down to said first, second and third buried P-type regions therein.

2. The method of claim 1 characterized further by the additional step of opening said second oxide layer over that portion of said P implanted surface area which extends beyond the periphery of said first N-type region, and depositing a metal contact through said opening to said implanted area.

3. The method of claim 1 characterized further in that the implantation of P-type dopant is at an energy level sufficient to drive said P-type dopant beyond the bottom of said first N doped region so as to create a buried P type shell under and around said first N doped region.

4. The method of claim 1 characterized further in that the P-type dopant implanted into said surface is driven, during the subsequent ones of said steps, into said silicon body beyond the bottom of said first N doped region so as to create a buried P-type shell under and around said first N doped region.

5. In a method of fabricating an integrated circuit the steps of:
   a. driving into first and second spaced apart regions in the surface of an N-type silicon body, an N conductivity dopant to create first and second N-type regions therein;
   b. driving into said surface a P-type dopant in selected areas to create a first P-type region entirely within said first N-type region and second and third spaced apart P-type regions entirely within said second N-type region;
   c. implanting a P-type dopant into said surface over an area which includes, and extends beyond all sides of, said first N doped region;
   d. growing an N-type epitaxial silicon layer on said surface, and auto-doping P-type dopant from said first, second and third P-type regions to form corresponding first, second and third buried P-type regions in said epitaxial layer;
   e. forming additional doped regions in said epitaxial layer to create separate vertical transistors whose emitters comprise said first and second N-type regions and whose bases comprise said first and third buried P-type regions, and isolating said transistors each from the other;
   f. making contact with said first N-type region through the surface of said silicon body; and
   g. making contact with said second N-type region through said silicon body.

6. The method of claim 5 characterized further in that said step of isolating said transistors each from the other includes removing portions of said epitaxial layer and the top layer of said body immediately underlying said portions so as to create first and second mesas based entirely within said first and second N-type regions and growing a protective oxide layer over said mesas and over the surface of said body exposed by the removal of said top layer.

7. The method of claim 5 characterized further in that the implantation of P-type dopant is at an energy level sufficient to drive said P-type dopant beyond the bottom of said first N doped region so as to create a buried P-type shell under and around said first N doped region.

8. The method of claim 5 characterized further in that the P-type dopant implanted into said surface is driven, during the subsequent ones of said steps, into said silicon body beyond the bottom of said first N doped region so as to create a buried P-type shell under and around said first N doped region.

* * * * *